(12) United States Patent
Koizumi et al.

(10) Patent No.: US 8,042,239 B2
(45) Date of Patent: Oct. 25, 2011

(54) PIEZOELECTRIC/ELECTROSTRICTIVE ELEMENT AND METHOD OF MANUFACTURING THE SAME

(75) Inventors: Takaaki Koizumi, Tajimi (JP); Hideki Shimizu, Ohbu (JP)

(73) Assignee: NGK Insulators, Ltd., Nagoya (JP)

( * ) Notice: Subject to any disclaimer, the term of this patent is extended or adjusted under 35 U.S.C. 154(b) by 220 days.

(21) Appl. No.: 12/367,701

(22) Filed: Feb. 9, 2009

(65) Prior Publication Data
US 2009/0205181 A1    Aug. 20, 2009

(30) Foreign Application Priority Data

Feb. 14, 2008  (JP) ................. 2008-033035

(51) Int. Cl.
*H01L 41/22* (2006.01)
*H01L 41/00* (2006.01)
*H04R 17/00* (2006.01)
*H02N 2/00* (2006.01)

(52) U.S. Cl. ............. 29/25.35; 310/311; 310/316.01; 310/317

(58) Field of Classification Search ............ 29/25.35; 310/311, 316.01, 317

See application file for complete search history.

(56) References Cited

U.S. PATENT DOCUMENTS

| 6,089,701 A * | 7/2000 | Hashizume et al. ........... 347/70 |
| RE39,474 E | 1/2007 | Hashizume et al. |
| 2006/0197407 A1* | 9/2006 | Vile et al. ................. 310/313 R |

FOREIGN PATENT DOCUMENTS

| JP | 3552013 B2 | 8/2004 |
| JP | 2007-17989 A1 | 7/2007 |

* cited by examiner

*Primary Examiner* — A. Dexter Tugbang
*Assistant Examiner* — David Angwin
(74) *Attorney, Agent, or Firm* — Burr & Brown

(57) ABSTRACT

A piezoelectric/electrostrictive element with improved moisture resistance while having less degradation in its piezoelectric/electrostrictive properties and a method of manufacturing such a piezoelectric/electrostrictive element are provided. A laminated vibrator of a piezoelectric/electrostrictive element has a structure in which an electrode film, a piezoelectric/electrostrictive film, another electrode film, another piezoelectric/electrostrictive film, and another electrode film are laminated one above the other. In the manufacture of the piezoelectric/electrostrictive element, the laminated vibrator and a counter electrode are immersed in an electrodeposition coating fluid containing a coating component so that the electrodeposition coating fluid is brought into contact with the surfaces of the laminated vibrator and the counter electrode. Thereafter, voltage is applied between an internal electrode film and the counter electrode to induce electrophoresis of the coating component toward a surface-exposed defect, whereby the coating material is selectively electrodeposited on the surface-exposed defect.

5 Claims, 8 Drawing Sheets

F I G . 1 6
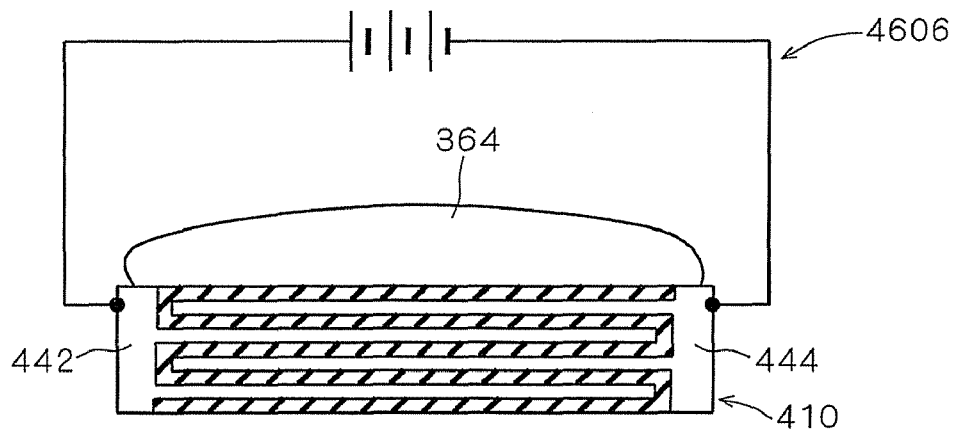
F I G . 1 7
|  | ORDINARY HUMIDITY CONDITIONS (40℃、55%) | | HIGH HUMIDITY CONDITIONS (40℃、85%) | |
| --- | --- | --- | --- | --- |
|  | DISPLACEMENT | INSULATION | DISPLACEMENT | INSULATION |
| EXAMPLE 1 | 100% | 100% | 100% | 100% |
| EXAMPLE 2 | 100% | 100% | 100% | 100% |
| EXAMPLE 3 | 100% | 100% | 100% | 100% |
| EXAMPLE 4 | 100% | 100% | 100% | 100% |
| COMPARATIVE EXAMPLE 1 | 100% | 100% | 65% | 52% |
| COMPARATIVE EXAMPLE 2 | 100% | 100% | 74% | 76% |

PIEZOELECTRIC/ELECTROSTRICTIVE ELEMENT AND METHOD OF MANUFACTURING THE SAME

BACKGROUND OF THE INVENTION

1. Field of the Invention

The present invention relates to a piezoelectric/electrostrictive element with improved moisture resistance while having less degradation in its piezoelectric/electrostrictive properties, and a method of manufacturing such a piezoelectric/electrostrictive element.

2. Description of the Background Art

Piezoelectric/electrostrictive actuators have the advantage of precise displacement control of the order of submicrons. In particular, piezoelectric/electrostrictive actuators employing a sintered piezoelectric/electrostrictive ceramic body as a piezoelectric/electrostrictive body have the advantages of, in addition to precise displacement control, high electromechanical conversion efficiency, high generative power, fast response speed, great durability, and low power consumption. Making use of these advantages, the piezoelectric/electrostrictive actuators are used for equipment such as inkjet printer heads and diesel engine injectors.

The piezoelectric/electrostrictive actuators employing a sintered piezoelectric/electrostrictive ceramic body as a piezoelectric/electrostrictive body, however, may at times suffer from the problem of a reduction in the amount of displacement at high humidities, regardless of the fact that there is no such problem at typical or ordinary humidity levels. The cause of such a reduction in the amount of displacement is considered because when a piezoelectric/electrostrictive actuator is polarized or repeatedly driven, stress is concentrated on where mechanical strength is low, such as at the grain boundary or in pores of a sintered piezoelectric/electrostrictive ceramic body, thereby forming microcracks or other defects, and subsequent possible water invasion into those defects may produce a conductive path, which consequently reduces the intensity of an electric field applied to a piezoelectric/electrostrictive film.

To prevent such a reduction in the amount of displacement at high humidities, it is effective to form a coating for covering microcracks or other defects, on the surface of a laminated vibrator made of laminations of a piezoelectric/electrostrictive film and an electrode film.

For example, Japanese Patent No. 3552013 describes a technique for improving moisture resistance by forming a coating (insulator layer 13) on the surface of a laminated vibrator (piezoelectric vibrator). Japanese Patent Application Laid-open No. 2007-175989 describes another technique for improving moisture resistance by forming a coating (protective film 100) on the surface of a laminated vibrator (piezoelectric vibrator 300).

However, although moisture resistance is improved by the formation of a coating on the surface of a laminated vibrator, the conventional techniques still have the problem of a reduced amount of displacement of a piezoelectric/electrostrictive actuator because the coating will restrain the laminated vibrator. To relax this problem, Japanese Patent Application Laid-open No. 2007-175989 has proposed that part of the coating be made of a pliant material (see paragraph [0051]); however, such a measure is insufficient to produce a satisfactory effect.

Note that this is not only the problem with piezoelectric/electrostrictive actuators but also the problem common to all piezoelectric/electrostrictive elements that include a laminated vibrator made of laminations of a piezoelectric/electrostrictive film and an electrode film.

SUMMARY OF THE INVENTION

According to a first aspect of the present invention, a method of manufacturing a piezoelectric/electrostrictive element including a laminated vibrator made of laminations of a piezoelectric/electrostrictive film and an electrode film includes the following steps: (a) bringing an electrodeposition coating fluid containing a coating component into contact with the laminated vibrator; and (b) selectively electrodepositing a coating material, which is to be a coating, on a defect exposed on a surface of the laminated vibrator and reaching a first electrode film of the laminated vibrator.

Since the coating covers the defect extended from the surface to first electrode film of the laminated vibrator, the moisture resistance of the piezoelectric/electrostrictive element is improved. In addition, the selective formation of the coating on the surface of the laminated vibrator thereby reduces degradation in the piezoelectric/electrostrictive properties of the piezoelectric/electrostrictive element due to the presence of the coating.

According to a second aspect of the present invention, a piezoelectric/electrostrictive element includes a laminated vibrator made of laminations of a piezoelectric/electrostrictive film and an electrode film; and a coating selectively covering a defect that is exposed on a surface of said laminated vibrator and reaches an electrode film of said laminated vibrator.

Since the coating covers the defect extended from the surface to first electrode film of the laminated vibrator, the moisture resistance of the piezoelectric/electrostrictive element is improved. In addition, the selective formation of the coating on the surface of the laminated vibrator additionally reduces degradation in the piezoelectric/electrostrictive properties of the piezoelectric/electrostrictive element due to the presence of the coating.

It is thus an object of the present invention to provide a piezoelectric/electrostrictive element that improves its moisture resistance while reducing degradation in its piezoelectric/electrostrictive properties.

These and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a schematic view of an electrodeposition machine used in manufacturing a piezoelectric/electrostrictive element according to the fourth preferred embodiment by a manufacturing method similar to the method of manufacturing a piezoelectric/electrostrictive element according to the third preferred embodiment.

FIG. 17 is a table showing pass rates for the amount of flexural displacement and for insulation resistance.

DETAILED DESCRIPTION OF THE INVENTION

1. First Preferred Embodiment

<1-1 Structure of Piezoelectric/Electrostrictive Element 10>

{Entire Structure}

Figure 1:
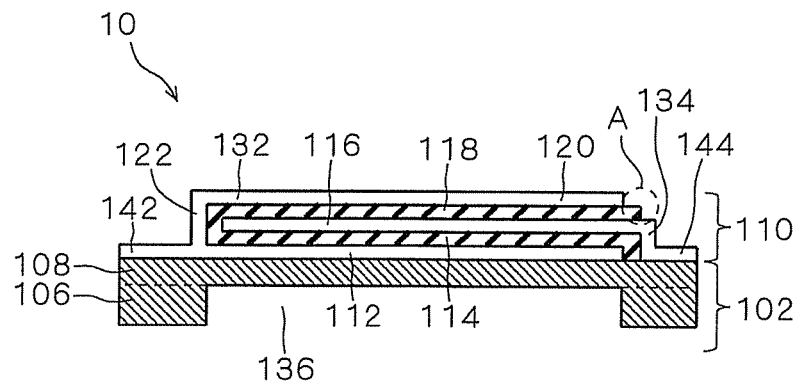
FIG. 1 is a sectional view of a piezoelectric/electrostrictive element manufactured by a method of manufacturing a piezoelectric/electrostrictive element according to a first preferred embodiment.

FIG. 1 diagrammatically illustrates a piezoelectric/electrostrictive element 10 manufactured by a method of manufacturing a piezoelectric/electrostrictive element according to a first preferred embodiment of the present invention. FIG. 1 is a sectional view of the piezoelectric/electrostrictive element 10. The piezoelectric/electrostrictive element 10 in FIG. 1 forms the major part of an inkjet actuator used in an inkjet printer head.

As illustrated in FIG. 1, the piezoelectric/electrostrictive element 10 has a structure in which a laminated vibrator 110 is fixedly attached to the upper surface of a substrate 102 above a hollow or cavity 136. The term "securely attached" refers to a connection of the laminated vibrator 110 to the substrate 102 by means of solid-phase reaction at the interface between the substrate 102 and the laminated vibrator 110, without the use of any organic or inorganic adhesive.

{Substrate 102}

The substrate 102 has a structure in which a base plate 106 and a diaphragm 108 are laminated from bottom to top in the order mentioned and integrated into a single unit.

The substrate 102 is an insulator structure. There is no limitation on the type of the insulator, but in terms of heat resistance, chemical stability, and electric insulation, the substrate 102 should preferably be a sintered ceramic body containing at least one component selected from the group consisting of zirconium oxide, aluminum oxide, magnesium oxide, mullite, aluminum nitride, and silicon nitride. In particular, a sintered ceramic body of stabilized zirconium oxide is more preferable in terms of mechanical strength and toughness. The "stabilized zirconium oxide" herein refers to zirconium oxide in which crystal phase transition is suppressed by the addition of a stabilizer, and it includes not only stabilized zirconium oxide but also partially stabilized zirconium oxide.

The base plate 106 has a structure in which the cavity 136 with a long, narrow rectangular plane configuration is formed in a plate of approximately uniform thickness.

The diaphragm 108 is a plate of approximately uniform thickness. The diaphragm 108 should preferably have a thickness between 0.5 and 200 µm. This is because the thickness below this range tends to cause damage to the diaphragm 108, while the thickness above this range tends to increase the stiffness of the diaphragm 108, thus reducing the amount of flexural displacement of the piezoelectric/electrostrictive element 10.

The substrate 102 is prepared by, for example, pressing and firing green sheets of an insulating ceramic.

Figure 2:
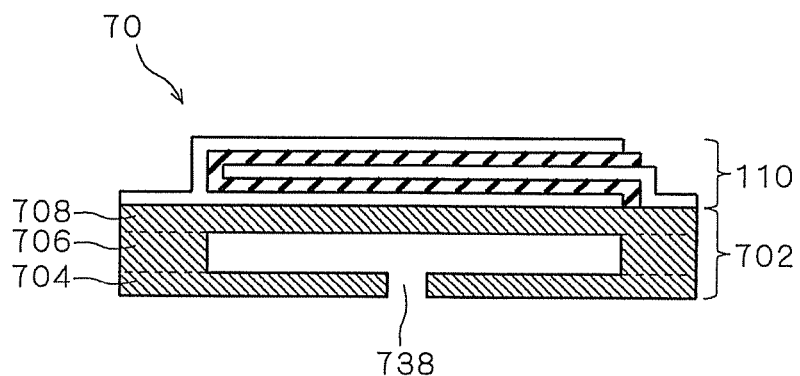
FIG. 2 is a sectional view of another example of the piezoelectric/electrostrictive element.

As a substitute for the substrate 102, a substrate 702 having a structure in which a base plate 704 having an inkjet hole 738 formed therein is further laminated under a base plate 704 and a diaphragm 708 which are similar respectively to the base plate 106 and the diaphragm 108 may be used as illustrated in the schematic view of a piezoelectric/electrostrictive element 70 in FIG. 2.

{Laminated Vibrator 110}

The laminated vibrator 110 has a structure in which an electrode film 112, a piezoelectric/electrostrictive film 114, another electrode film 116, another piezoelectric/electrostrictive film 118, and another electrode film 120 are laminated from bottom to top in the order mentioned.

The electrode films 112, 116, and 120 are films made of a conductor. There is no limitation on the type of the conductor, but in terms of electrical resistance and heat resistance, the electrode films 112, 116, and 120 should preferably be a metal such as platinum, palladium, rhodium, gold, or silver; or an alloy containing such a metal as the main component. In particular, platinum with excellent heat resistance, or an alloy containing platinum as the main component is more preferable.

The electrode films 112, 116, and 120 should preferably have a thickness between 0.1 and 15 µm. This is because the thickness above this range tends to increase the stiffness of the electrode films 112, 116, and 120, thus reducing the amount of flexural displacement of the piezoelectric/electrostrictive element 10, while the thickness below this range tends to increase the electrical resistances of the electrode films 112, 116, and 120.

The electrode films 112, 116, and 120 may be formed by applying either a paste where a conductive material is dispersed in a dispersion medium or a solution where resinate as a conductive material dissolves in a solvent and then by firing a resultant conductive material film after removal of the dispersion medium or the solvent. Or, they may be formed by deposition of a conductive material. The application of a paste is made by screen printing or any other similar technique, and the application of a solution is made by spin coating, spraying, or any other similar technique. The deposition of a conductive material is made by sputtering, resistance heating, or any other similar technique. Of course, these are only just examples of the method of formation, and other methods may be employed.

The piezoelectric/electrostrictive films 114 and 118 are films made of a piezoelectric/electrostrictive body. There is no limitation on the type of the piezoelectric/electrostrictive body, but in terms of electric-field-induced strains, the piezoelectric/electrostrictive films 114 and 118 should preferably be a sintered ceramic body of lead (Pb)-based perovskite oxide, and more preferably be a sintered ceramic body of lead zirconate titanate ($Pb(Zr_xTi_{1-x})O_3$) or of lead zirconate titanate into which a simple oxide, a complex pevroskite oxide, or the like has been introduced. In particular, the piezoelectric/electrostrictive films 114 and 118 should more preferably be a sintered ceramic body containing nickel oxide (NiO) introduced in a solid solution of lead zirconate titanate and lead magnesium niobate ($Pb(Mg_{1/3}Nb_{2/3})O_3$), or a sintered ceramic body of a solid solution of lead zirconate titanate and lead nickel niobate ($Pb(Ni_{1/3}Nb_{2/3})O_3$).

The piezoelectric/electrostrictive films 114 and 118 should preferably have a thickness between 0.2 and 50 μm. This is because the thickness below this range tends to result in insufficient densification of the piezoelectric/electrostrictive films 114 and 118, while the thickness above this range tends to increase the shrinkage stress of the piezoelectric/electrostrictive films 114 and 118 during sintering, thus requiring an increase in the thickness of the diaphragm 108.

The piezoelectric/electrostrictive films 114 and 118 are formed by applying a paste where a piezoelectric/electrostrictive material is dispersed in a dispersion medium and then by firing a resultant piezoelectric/electrostrictive material film after removal of the dispersion medium. The application of a paste is made by screen printing or any other similar technique. Alternatively, the piezoelectric/electrostrictive films 114 and 118 may be formed by immersing a work-in-process into a slurry where a piezoelectric/electrostrictive material is dispersed in a dispersion medium to thereby induce electrophoresis of the piezoelectric/electrostrictive material toward an electrode film and then by firing a resultant piezoelectric/electrostrictive material film. Of course, these are only just examples of the method of formation, and other methods may be employed.

The electrode films 112 and 116 are opposed to each other with the piezoelectric/electrostrictive film 114 therebetween, and the electrode films 116 and 120 are opposed to each other with the piezoelectric/electrostrictive film 118 therebetween. While FIG. 1 illustrates the case where the laminated vibrator 110 includes two layers of the piezoelectric/electrostrictive films 114 and 118, the laminated vibrator may include three or more layers of piezoelectric/electrostrictive films. A laminated vibrator including three or more layers of piezoelectric/electrostrictive films has a structure in which a piezoelectric/electrostrictive film and an electrode film are alternately laminated one above another. In this case, the lowermost or uppermost layer of the laminated vibrator may be an inactive piezoelectric/electrostrictive film that is not sandwiched by electrode films so that no electric field is applied. The present invention is also applicable to the case where a laminated vibrator includes only a single piezoelectric/electrostrictive film and has electrode films formed on both main surfaces of the piezoelectric/electrostrictive film.

While the major part of the electrode film 112 is situated between the substrate 102 and the piezoelectric/electrostrictive film 114, the electrode film 112 has its one end extending outside the area where the cavity 136 is formed and thus making a feeder 142 for giving a drive signal. While the major part of the electrode film 116 is situated between the piezoelectric/electrostrictive films 114 and 118, the electrode film 116 has its one end extending from between the piezoelectric/electrostrictive films 114 and 118 to the outside of the area where the cavity 136 is formed and thus making a feeder 144 for giving a drive signal. The electrode films 112 and 120 are electrically short-circuited by an electrode film 122 formed on the end faces of the piezoelectric/electrostrictive films 114 and 118. In the following description, these electrically short-circuited electrode films 112, 120, and 122 are referred to as an "external electrode film 132", and the electrode film 116 that is not electrically short-circuited to the external electrode film 132 as an "internal electrode film 134."

{Coating 128}

Figure 3:
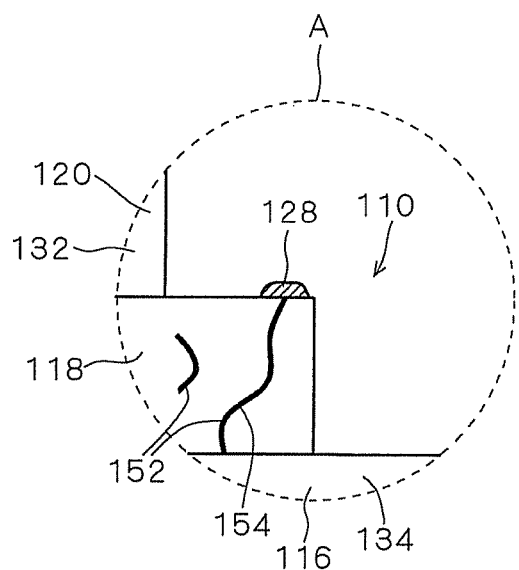
FIG. 3 is an enlarged schematic view of a portion A in FIG. 1.

FIG. 3 is an enlarged schematic view of a portion A in FIG. 1. As illustrated in FIG. 3, the piezoelectric/electrostrictive film 118 possesses a large number of microcracks and other defects (hereinafter referred to simply as "defects") 152. Some of the defects (hereinafter referred to as "surface-exposed defects") 154 are exposed on the surface of the laminated vibrator 110 and reaches the internal electrode film 134. The piezoelectric/electrostrictive element 10 includes coatings 128 that selectively cover the surface-exposed defects 154. The positions, sizes, number, and the like of surface-exposed defects 154 vary in each piezoelectric/electrostrictive element 10, and so do the positions, sizes, number, and the like of coatings 128 in each piezoelectric/electrostrictive element 10. The formation of the coatings 128 on the surface of the laminated vibrator 110 prevents moisture invasion into the surface-exposed defects 154, thereby preventing the formation of a conductive path that connects the surface of the laminated vibrator 110 and the internal electrode film 134. This improves the moisture resistance of the piezoelectric/electrostrictive element 10. In addition, the selective formation of the coatings 128 on the surface of the piezoelectric/electrostrictive element 10 reduces degradation in the piezoelectric/electrostrictive properties of the piezoelectric/electrostrictive element 10 due to the presence of the coatings 128.

The coatings 128 are films made of an insulator. The coatings 128 are formed by electrodepositing a coating material on the surface-exposed defects 154 exposed on the surface of the laminated vibrator 110 and then by subjecting the laminated vibrator 110 to post treatment.

{Operation of Piezoelectric/Electrostrictive Element 10}

In the configuration described above, when a drive signal is fed between the feeders 142 and 144 and an electric field is applied to the piezoelectric/electrostrictive films 114 and 118, the piezoelectric/electrostrictive films 114 and 118 are expanded and contracted in a direction perpendicular to the direction of lamination, which causes a bending of the united diaphragm 108 and laminated vibrator 110. With this bending, the piezoelectric/electrostrictive element 10 will press ink in the cavity 136.

<1-2. Method of Manufacturing Piezoelectric/Electrostrictive Element 10>

Figure 4:
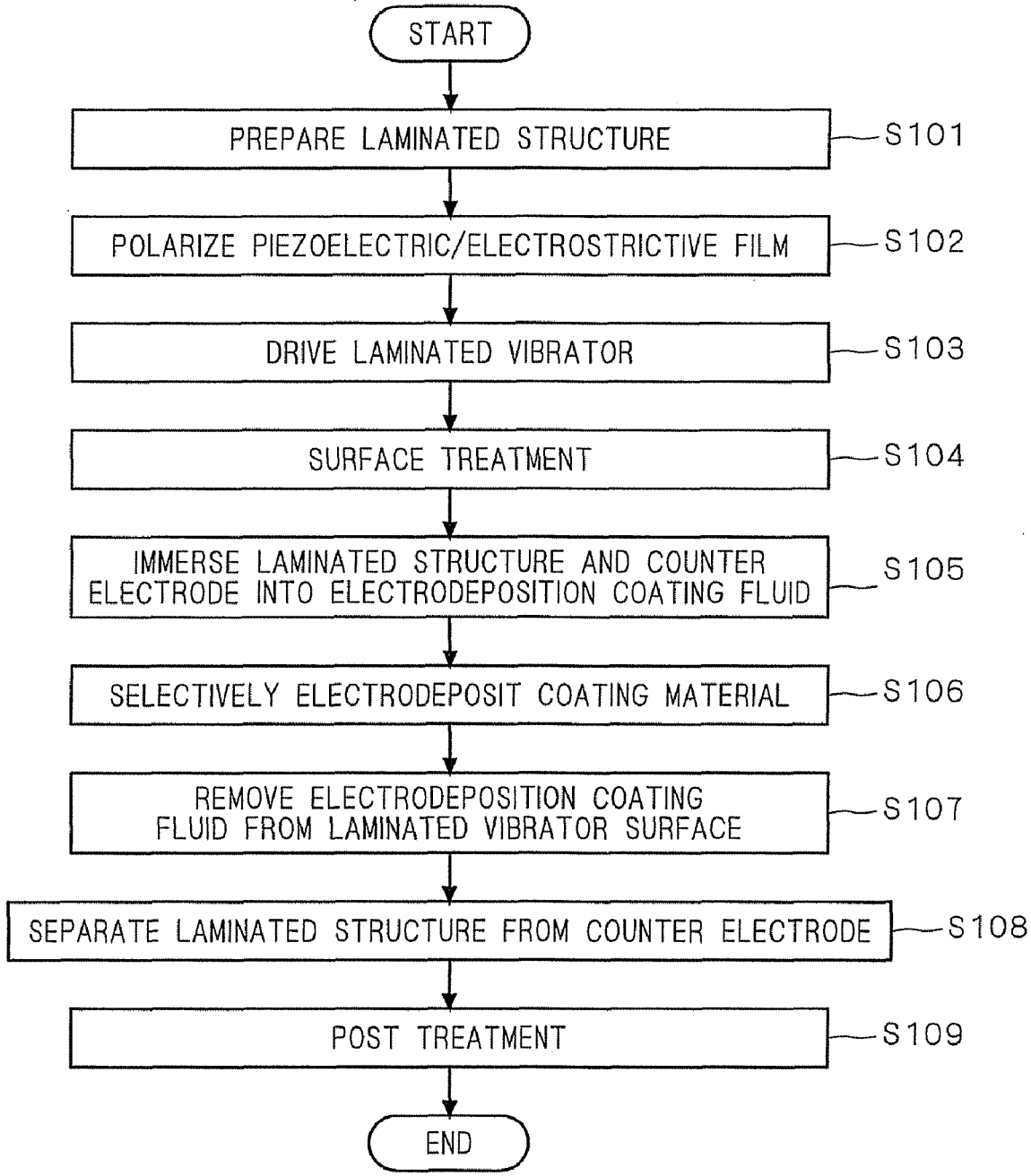
FIG. 4 is a flow chart for explaining the method of manufacturing a piezoelectric/electrostrictive element according to the first preferred embodiment.
Figure 5:
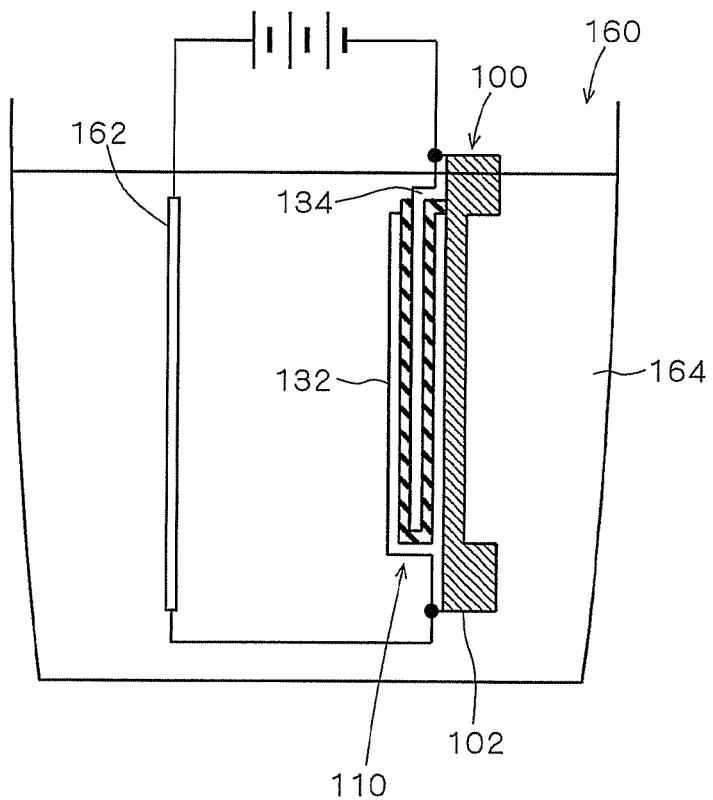
FIG. 5 is a schematic view of an electrodeposition machine used in the method of manufacturing a piezoelectric/electrostrictive element according to the first preferred embodiment.

FIG. 4 is a flow chart for explaining a method of manufacturing a piezoelectric/electrostrictive element according to the first preferred embodiment. FIG. 5 is a schematic view of an electrodeposition machine used in the method of manufacturing a piezoelectric/electrostrictive element according to the first preferred embodiment.

{Preparation of Laminated Structure 100}

As illustrated in FIG. 4, in the manufacture of a piezoelectric element, a laminated structure 100 is first prepared by fixedly attaching the laminated vibrator 110 to the upper surface of the substrate 102 (in step S101).

{Growth of Defects}

Then, direct voltage is applied between the feeders 142 and 144 to polarize the piezoelectric/electrostrictive films 114 and 118 (in step S102), and a drive signal is applied between the feeders 142 and 144 to drive the laminated vibrator 110 (in step S103). Such polarization and drive are not an absolute necessity prior to the immersion of the laminated structure 100 in an electrodeposition coating fluid 164, but the polarization and drive in advance will allow advance growth of defects, which might be generated afterward, and advance covering of such defects with the coatings 128. This further improves the moisture resistance of the piezoelectric/electrostrictive element 10. The process for growing defects in advance should preferably include both the polarization and the drive; however it may include only either one of the polarization and the drive. Alternatively, instead of or in addition to the polarization and the drive, a heat shock test in which the laminated structure 100 is alternately exposed to high and low temperatures, or any other similar process may be performed. Still alternatively, this process for growing defects in advance may be omitted.

{Surface Treatment}

The laminated vibrator 110 is then subjected to surface treatment for improving the adhesion of the coatings 128 to the surface of the laminated vibrator 110 (in step S104). Performing the surface treatment before immersion of the laminated structure 100 in the electrodeposition coating fluid 164 will improve the adhesion of the coatings 128 to the surface of the laminated structure 100, thus further improving the moisture resistance of the piezoelectric/electrostrictive element 10. The surface treatment for improving the adhesion of coatings to the surface of the laminated vibrator 110 includes the process for removing an organic compound adhering to the surface of the laminated vibrator 110 by plasma-cleaning, the process for forming a self-organizing film on the surface of the laminated vibrator 110, and the like. Alternatively, the surface treatment may be performed prior to the process for growing defects. Still alternatively, the surface treatment may be omitted.

{Electrodeposition of Coating Material}

Then, as illustrated in FIG. 5, with the external electrode film 132 electrically short-circuited to a counter electrode 162 provided separately from the laminated vibrator 110, the entire laminated structure 100 and the counter electrode 162 are immersed in the electrodeposition coating fluid 164 containing a coating component to bring the electrodeposition coating fluid 164 into contact with the surfaces of the laminated vibrator 110 and the counter electrode 162 (in step S105).

Figure 6:
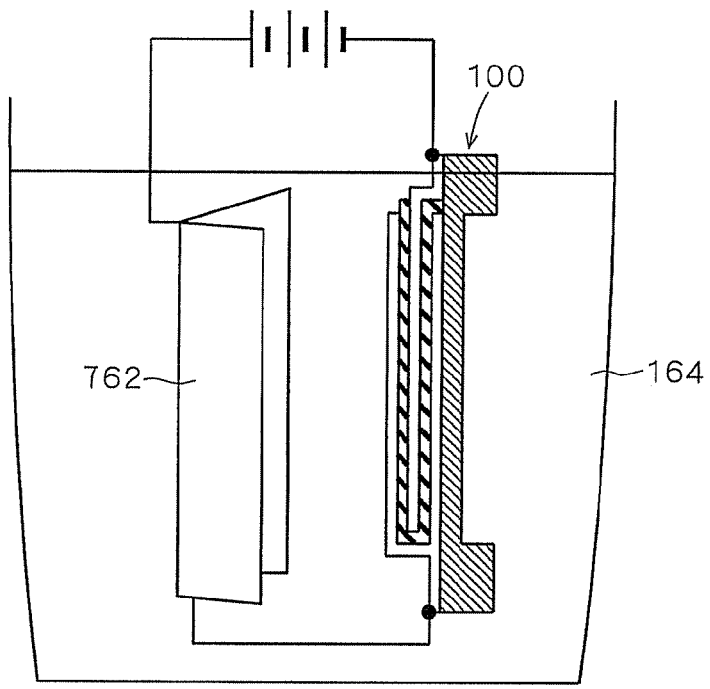
FIG. 6 is a schematic view of another example of the electrodeposition machine.
Figure 7:
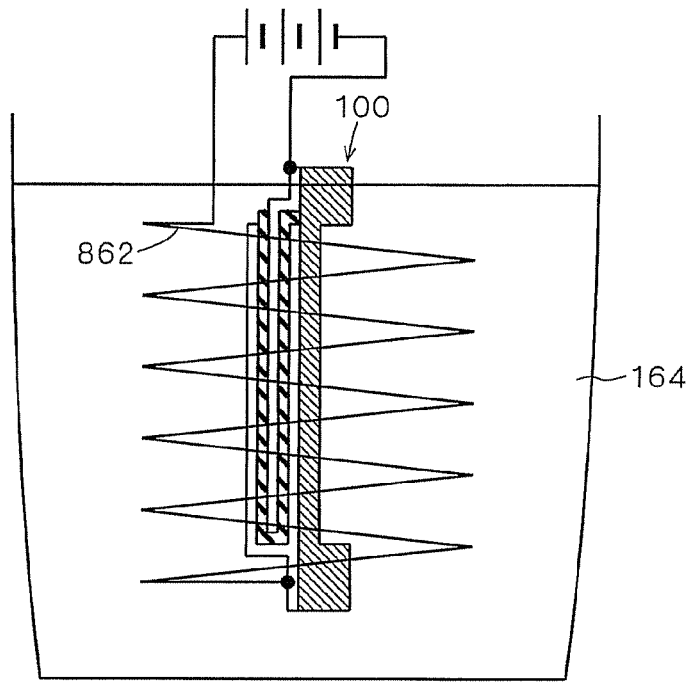
FIG. 7 is a schematic view of still another example of the electrodeposition machine.

The counter electrode 162 is a flat plate made of platinum. Of course, the counter electrode 162 may be made of a metal other than platinum. Being a flat plate is not an absolute necessity for the counter electrode 162. Thus, a counter electrode 762 which is a bending plate as illustrated in FIG. 6, or a counter electrode 862 which is a coil that can house the laminated structure 100 therein as illustrated in FIG. 7 may be used as a substitute for the counter electrode 162.

The electrodeposition coating fluid 164 may be either a solution where a coating component is dissolved in a solvent or a fluid dispersion where a coating component is dispersed in a dispersion medium. The electrodeposition coating fluid 164 may be either of a cation type where the coating component becomes positively charged or of an anion type where the coating component becomes negatively charged. Examples of the coating material include a carbon polymer compound such as an epoxy resin, a polyimide resin, a polyamide-imide resin, or acrylic resin; a silicon polymer compound such as a silicone resin; and nanoparticles of oxide such as alumina where a dispersing agent is absorbed and electrically charged on the surface. Examples of the solvent or the dispersion medium include an inorganic solvent such as water; and an organic solvent such as alcohol. Alternatively, the electrodeposition coating fluid 164 may contain a curing agent such as blocked isocyanate; or a catalyst such as a tin compound.

After the laminated structure 100 and the counter electrode 162 are immersed in the electrodeposition coating fluid 164, voltage is applied between the internal electrode film 134 and the counter electrode 162 to induce electrophoresis of the coating material toward the surface-exposed defects 154, whereby the coating material is selectively electrodeposited on the surface-exposed defects 154 (in step S106). When the electrodeposition coating fluid 164 is of the cation type, the internal electrode film 134 is connected to the negative pole of the power supply, and the counter electrode 162 to the positive pole. When the electrodeposition coating fluid 164 is of the anion type, the internal electrode film 134 is connected to the positive pole of the power supply, and the counter electrode 162 to the negative pole. The selective electrodeposition on the surface-exposed defects 154 is possible because the surface-exposed defects 154 make a conductive path so that an electric field formed between the internal electrode film 134 and the counter electrode 162 leaks out of the surface-exposed defects 154 into the electrodeposition coating fluid 164, thereby causing the coating component to be drawn to the surface-exposed defects 154.

Here, the external electrode film 132 is electrically short-circuited to the counter electrode 162 so that the external electrode film 132 has a potential equal to that of the counter electrode 162. Thus, even if the major part of the external electrode film 132 is situated on the surface of the laminated structure 100 and in contact with the electrodeposition coating fluid 164, the coating material is less prone to being adhered to the surface of the external electrode film 132. This, however, does not make it an absolute necessity to make an electrical short circuit between the counter electrode 162 and parts of the electrode films 112, 116, 120, and 120 of the laminated vibrator 110 so that those electrode films are connected to the same pole as the counter electrode 162. That is, all the electrode films 112, 116, 120, and 122 may be connected to the pole opposite to that to which the counter electrode 162 is connected.

After the electrodeposition of the coating material on the surface-exposed defects 154, the laminated structure 100 and the counter electrode 162 are pulled up from the electrodeposition coating fluid 164 to remove the electrodeposition coating fluid 164 from the surface of the laminated vibrator 110 (in step S107), and then the laminated structure 100 is separated from the counter electrode 162 (in step S108).

{Post Treatment}

The laminated structure 100 separated from the counter electrode 162 is then subjected to post treatment so that the film of the coating material makes the ultimate coatings 128 (in step S109). The post treatment includes the process for hardening the film of the coating material, the process for increasing the densification of the film of the coating material, the process for enhancing the adhesion of the film of the coating material to the surface of the laminated vibrator 110, the process for removing an unnecessary part of the adhered coating material, and the like. For example when the coating material is a resin, it is preferable that polymerization reaction be caused by heating or light irradiation. When the coating material is nanoparticles of oxide, it is preferable that the coating material be sintered by firing. If a large amount of coating material has been adhered to the surface of the external electrode film 132 due to the absence of an electrical short circuit between the external electrode film 132 and the counter electrode 162, the coating material should preferably be removed by mechanical polishing or the like.

2. Second Preferred Embodiment

A second preferred embodiment relates to another electrodeposition process of a coating material, which can be adopted as a substitute for the electrodeposition process for producing a coating material (steps S105 to S108) according to the first preferred embodiment.

Figure 8:
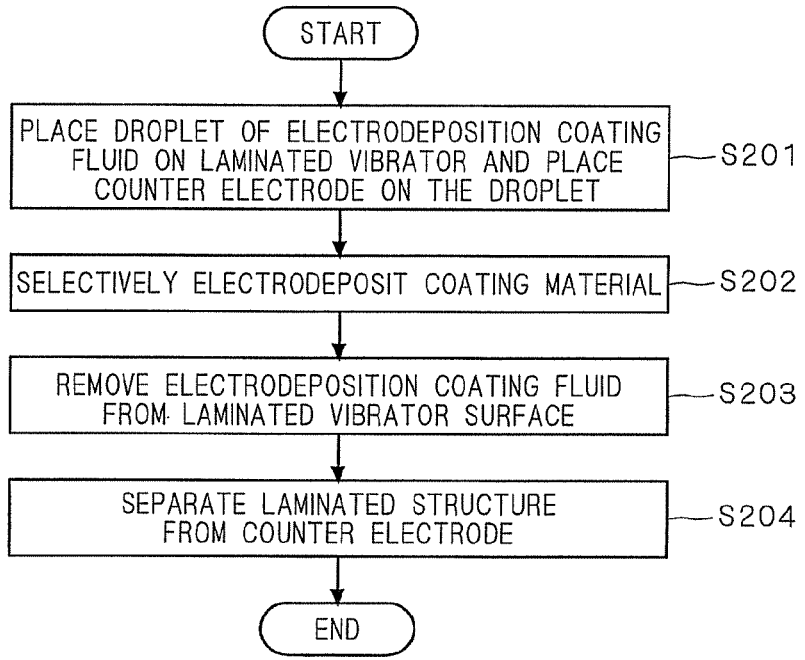
FIG. 8 is a flow chart for explaining an electrodeposition process for producing a coating material according to a second preferred embodiment.
Figure 9:
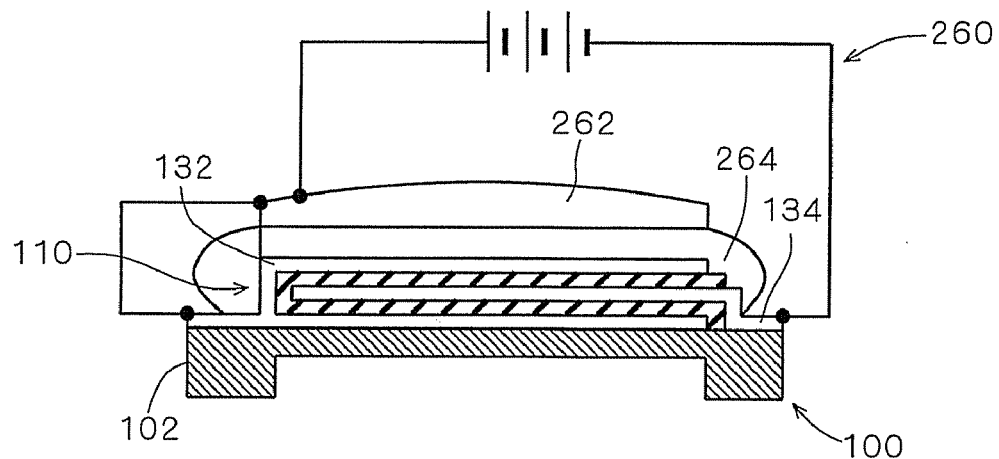
FIG. 9 is a schematic view of an electrodeposition machine used in the electrodeposition process for producing a coating material according to the second preferred embodiment.

FIG. 8 is a flow chart for explaining the electrodeposition process for producing a coating material according to the second preferred embodiment. FIG. 9 is a schematic view of an electrodeposition machine 260 used in the electrodeposition process for producing a coating material according to the second preferred embodiment.

In the electrodeposition process for producing a coating material according to the second preferred embodiment, first of all, as illustrated in FIG. 9, with the external electrode film 132 electrically short-circuited to a counter electrode 262 provided separately from the laminated vibrator 110, a droplet of an electrodeposition coating fluid 264 is placed on the laminated vibrator 110 and the counter electrode 262 is formed on that droplet, so that the electrodeposition coating fluid 264 is brought into contact with the surfaces of the laminated vibrator 110 and the counter electrode 262 (in step S201). The counter electrode 262 and the electrodeposition coating fluid 264 may be the same as the counter electrode 162 and the electrodeposition coating fluid 164 used in the electrodeposition process of a coating material according to the first preferred embodiment. As described, the electrodeposition fluid 264 is brought into contact with only the portion of the surface of the laminated structure 100 that requires electrodeposition of the coating material. This prevents the coating material from being adhered to where the formation of the coatings 128 is unnecessary.

Thereafter, voltage is applied between the internal electrode film 134 and the counter electrode 262 to induce electrophoresis of a coating component toward the surface-exposed defects 154, whereby the coating material is selectively electrodeposited on the surface-exposed defects 154 (in step S202). The selective electrodeposition on the surface-exposed defects 154 is possible because the surface-exposed defects 154 make a conductive path so that an electric field formed between the internal electrode film 134 and the counter electrode 262 leaks out of the surface-exposed defects 154 into the electrodeposition fluid 264, thereby causing the coating component to be drawn to the surface-exposed defects 154. After the electrodeposition of the coating material on the surface-exposed defects 154, the electrodeposition coating fluid 264 is removed from the surface of the laminated vibrator 110 (in step S203), and the laminated structure 100 is separated from the counter electrode 262 (in step S204).

3. Third Preferred Embodiment

A third preferred embodiment relates to still another electrodeposition process of a coating material, which can be adopted as a substitute for the electrodeposition of producing a coating material (steps S105 to S108) according to the first preferred embodiment.

Figure 10:
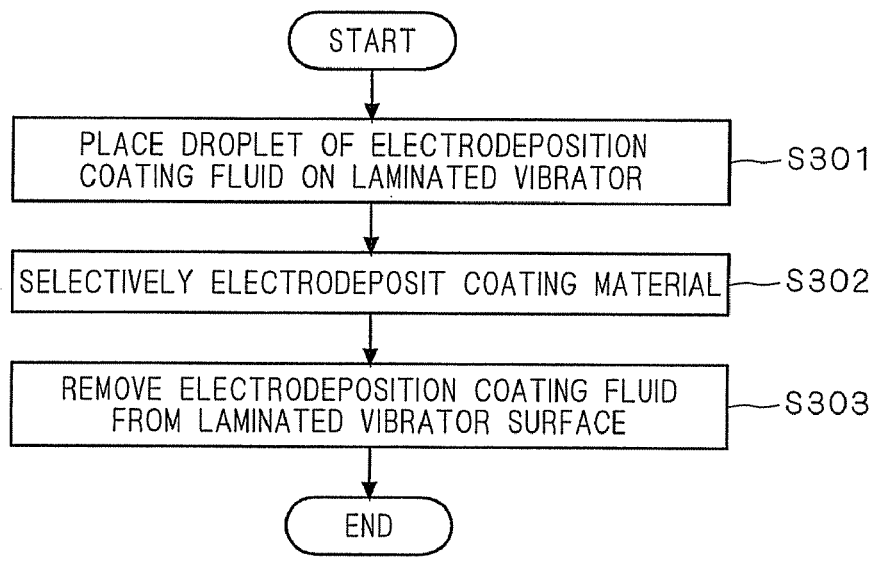
FIG. 10 is a flow chart for explaining an electrodeposition process for producing a coating material according to a third preferred embodiment.
Figure 11:
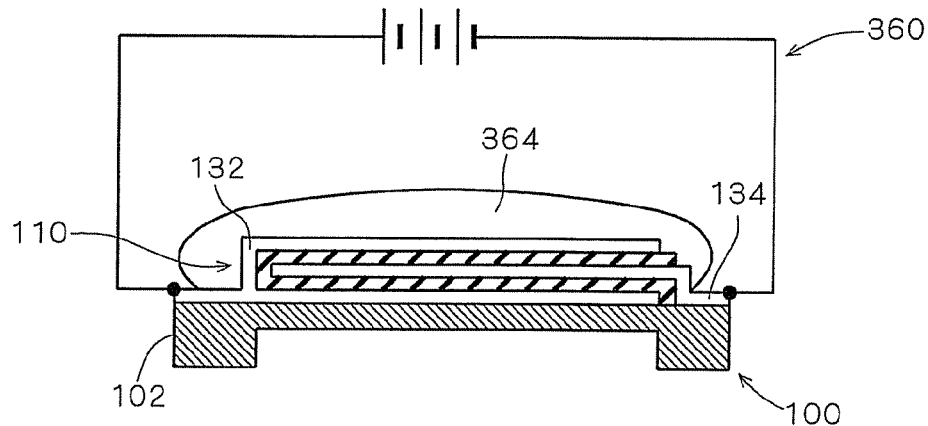
FIG. 11 is a schematic view of an electrodeposition machine used in the electrodeposition process for producing a coating material according to the third preferred embodiment.

FIG. 10 is a flow chart for explaining the electrodeposition process of a coating material according to the third preferred embodiment. FIG. 11 is a schematic view of an electrodeposition machine 360 used in the electrodeposition process for producing a coating material according to the third preferred embodiment.

In the electrodeposition process of a coating material according to the third preferred embodiment, first of all, a droplet of an electrodeposition coating fluid 364 is placed on the laminated vibrator 110 so as to bring the electrodeposition coating fluid 364 into contact with the surface of the laminated vibrator 110 (in step S301). The electrodeposition coating fluid 364 may be the same as the electrodeposition coating fluid 164 used in the electrodeposition of producing a coating material according to the first preferred embodiment. As described, the electrodeposition fluid 364 is brought into contact with only the portion of the surface of the laminated structure 100 that requires electrodeposition of a coating material. This prevents the coating material from being adhered to where the formation of the coatings 128 is unnecessary.

Thereafter, voltage is applied between the internal electrode film 134 and the external electrode film 132 to induce electrophoresis of a coating component toward the surface-exposed defects 154, whereby the coating material is selectively electrodeposited on the surface-exposed defects 154 (in step S302). The selective electrodeposition on the surface-exposed defects 154 is possible because the surface-exposed defects 154 make a conductive path so that an electric field formed between the internal electrode film 134 and the external electrode film 132 leaks out of the surface-exposed defects 154 into the electrodeposition fluid 364, thereby causing the coating component to be drawn to the surface-exposed defects 154. After the electrodeposition of the coating material on the surface-exposed defects 154, the electrodeposition coating fluid 364 is removed from the surface of the laminated vibrator 110 (in step S303).

4. Fourth Preferred Embodiment

<4-1. Structure of Piezoelectric/Electrostrictive Element 40>

Figure 12:
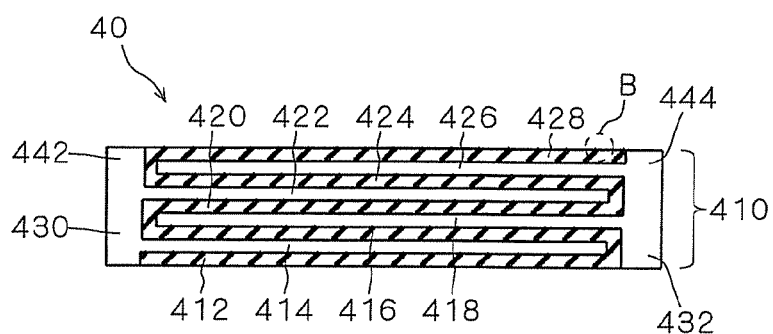
FIG. 12 is a sectional view of a piezoelectric/electrostrictive element manufactured by a same manufacturing method as the method of manufacturing a piezoelectric/electrostrictive element according to first to third preferred embodiments.

FIG. 12 is a schematic view of a piezoelectric/electrostrictive element 40 manufactured by a manufacturing method similar to the methods of manufacturing a piezoelectric/electrostrictive element according to the first to third preferred embodiments of the present invention. FIG. 12 shows a cross section of the piezoelectric/electrostrictive element 40. The piezoelectric/electrostrictive element 40 in FIG. 12 forms the major part of an inkjet actuator used in an inkjet printer head.

As illustrated in FIG. 12, a laminated vibrator 410 of the piezoelectric/electrostrictive element 40 has a structure in which a piezoelectric/electrostrictive film 412, an electrode film 414, another piezoelectric/electrostrictive film 416, another electrode film 418, another piezoelectric/electrostrictive film 420, another electrode film 422, another piezoelectric/electrostrictive film 424, another electrode film 426, and another piezoelectric/electrostrictive film 428 are laminated one above another in the order mentioned. While FIG. 12 illustrates the case where the laminated vibrator 410 includes five layers of the piezoelectric/electrostrictive films 412, 416, 420, 424, and 428, the number of piezoelectric/electrostrictive films of the laminated vibrator may be increased or reduced. The present invention is also applicable even to the case where a laminated vibrator includes only a single piezoelectric/electrostrictive film and has electrode films formed on both main surfaces of the piezoelectric/electrostrictive film.

The piezoelectric/electrostrictive films 412, 416, 420, 424, and 428 and the electrode films 414, 418, 422, and 426 can be formed of the same materials and by the same methods as the piezoelectric/electrostrictive films 114 and 118 and the electrode films 112, 116, and 120 of the piezoelectric/electrostrictive element 10 according to the first preferred embodiment.

The electrode films 414 and 422 are exposed on one side of the laminated vibrator 410 and electrically short-circuited to each other by an electrode film 430 formed on that side. The electrode films 418 and 426 are exposed on the other side of the laminated vibrator 410 and electrically short-circuited to each other by an electrode film 432 formed on that side. Parts of the electrode films 430 and 432 make feeders 442 and 444, respectively, for giving a drive signal.

Figure 13:
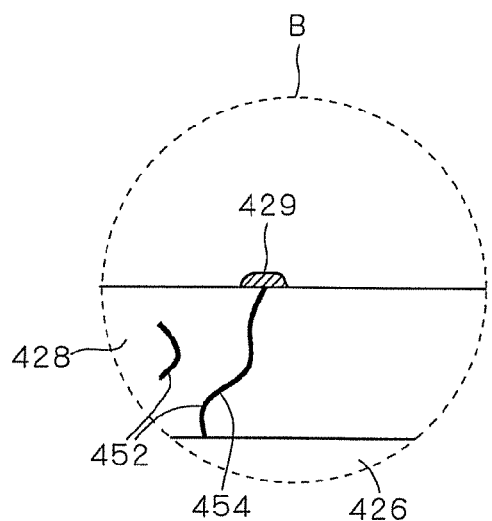
FIG. 13 is an enlarged schematic view of a portion B in FIG. 12.

FIG. 13 is an enlarged schematic view of a portion B in FIG. 12. As illustrated in FIG. 13, the piezoelectric/electrostrictive film 428 of the laminated vibrator 410 possesses defects 452. Some of the defects, namely surface-exposed defects 454, are exposed on the surface of the laminated vibrator 410 and reaches the electrode film 426. The piezoelectric/electrostrictive element 40 includes coatings 429 that selectively cover the surface-exposed defects 454. The positions, sizes, number, and the like of surface-exposed defects 454 vary in each piezoelectric/electrostrictive element 40, and so do the positions, sizes, number, and the like of coatings 429 in each piezoelectric/electrostrictive element 40. The formation of the coatings 429 on the surface of the laminated vibrator 410 prevents moisture invasion into the surface-exposed defects 454, thereby preventing the formation of a conductive path that connects the surface of the laminated vibrator 410 and an internal electrode film 434. This improves the moisture resistance of the piezoelectric/electrostrictive element 40.

The coatings 429 are films made of an insulator. The coatings 429 are formed by electrodepositing a coating material on the surface-exposed defects 454 exposed on the surface of the laminated vibrator 410 and then by subjecting the laminated vibrator 410 to post treatment.

<Operation of Piezoelectric/Electrostrictive Element 40>

In the configuration described above, when a drive signal is fed between the feeders 442 and 444 and an electric field is applied to the piezoelectric/electrostrictive films 412, 416, 420, 424, and 428, the piezoelectric/electrostrictive films 412, 416, 420, 424, and 428 are expanded and contracted in a direction perpendicular to the direction of lamination. With this expansion and contraction, the piezoelectric/electrostrictive element 40 can press ink.

{Manufacture of Piezoelectric/Electrostrictive Element 40}

Figure 14:
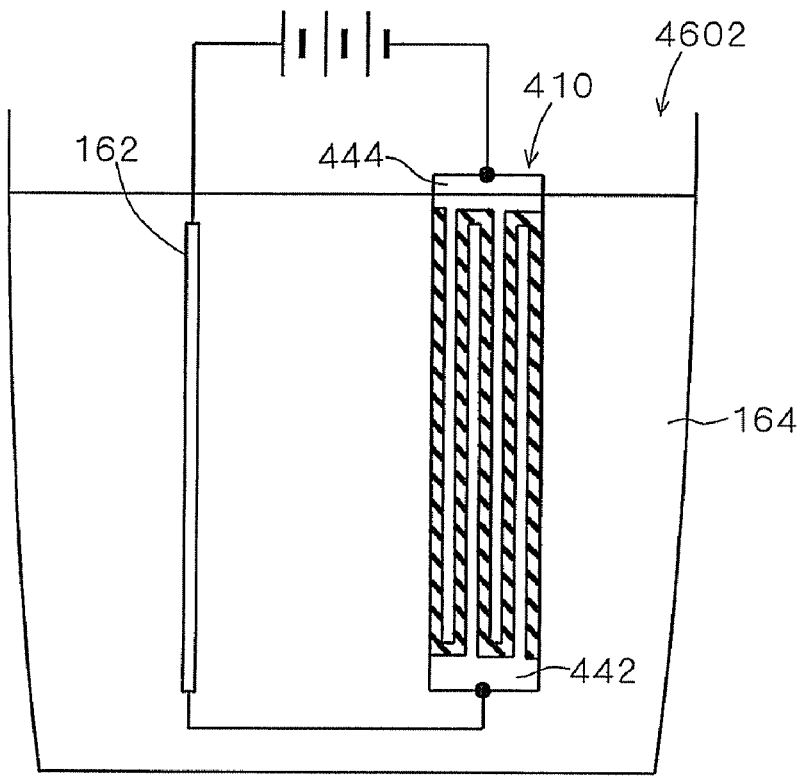
FIG. 14 is a schematic view of an electrodeposition machine used in manufacturing a piezoelectric/electrostrictive element according to a fourth preferred embodiment by a manufacturing method similar to the method of manufacturing a piezoelectric/electrostrictive element according to the first preferred embodiment.
Figure 15:
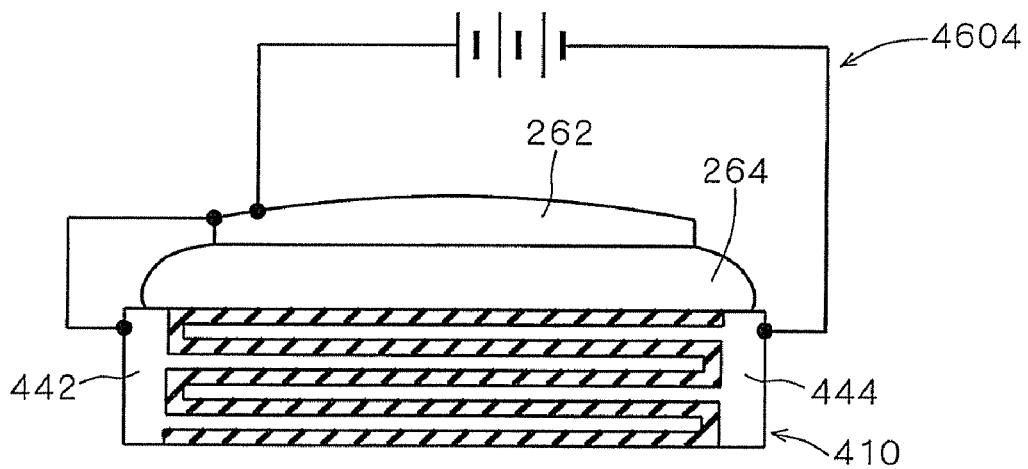
FIG. 15 is a schematic view of an electrodeposition machine used in manufacturing a piezoelectric/electrostrictive element according to the fourth preferred embodiment by a manufacturing method similar to the method of manufacturing a piezoelectric/electrostrictive element according to the second preferred embodiment.

This piezoelectric/electrostrictive element 40 can also be manufactured by a manufacturing method similar to the methods of manufacturing a piezoelectric/electrostrictive element according to the first to third preferred embodiments. FIGS. 14 to 16 are schematic views of electrodeposition machines 4602, 4604, and 4606, respectively, that are used in manufacturing the piezoelectric/electrostrictive element 40 according to the fourth preferred embodiment by a manufacturing method similar to the methods of manufacturing a piezoelectric/electrostrictive element according to the first to third preferred embodiments. As illustrated in FIGS. 14 to 16, in manufacturing the piezoelectric/electrostrictive element 40 by the manufacturing method similar to the methods of manufacturing a piezoelectric/electrostrictive element according to the first to third preferred embodiments, the feeders 442 and 444 are used respectively as substitutes for the feeders 142 and 144 of the piezoelectric/electrostrictive element 10.

<Modifications>

The above description has given the methods of manufacturing a piezoelectric/electrostrictive element, taking an actuator as an example. Those manufacturing methods can also produce a piezoelectric/electrostrictive element other than an actuator, e.g., a sensor or a resonator, in a similar fashion, and can produce a piezoelectric/electrostrictive element in which surface-exposed defects are selectively covered with coatings. However, the effect of improving moisture resistance in adopting the method of manufacturing a piezoelectric/electrostrictive element according to the present invention is in particular noticeable in actuators, because the actuators usually produce significant deformation in piezoelectric/electrostrictive films and thus are likely to generate surface-exposed defects.

EXAMPLES

Example 1

In Example 1, the piezoelectric/electrostrictive element 10 was manufactured by the method of manufacturing a piezoelectric/electrostrictive element according to the first preferred embodiment. In Example 1, however, the surface treatment in step S104 was omitted.

In Example 1, the substrate 102 was made of partially stabilized zirconium oxide; the electrode films 112 and 116 of platinum; the electrode film 120 of gold; and the piezoelectric/electrostrictive films 114 and 118 of a solid solution of lead zirconate titanate and lead nickel niobate. The electrodeposition coating fluid 164 was of an aqueous cation type, in which a coating component was an epoxy resin. Electrophoretic conditions for electrodeposition of the coating material were a temperature of 25° C., an applied voltage of 400 V, and a voltage application time of 20 seconds. Further, post treatment involved cleaning; 15-minute preliminary drying at 100° C.; and subsequent hardening of the epoxy resin by ultraviolet irradiation. This produced the coatings 128 having a thickness of 0.3 μm.

As to the resultant piezoelectric/electrostrictive element 10, the laminated vibrator 110 was driven at 40° C. and at ordinary humidity of 55% to measure the amount of flexural displacement with a laser Doppler displacement meter and the insulation resistance with an insulation testing set. Thereafter, the laminated vibrator 110 was driven at 40° C. and at high humidity of 85% to measure the amount of flexural displacement and the insulation resistance in a similar fashion, to thereby check the pass rates therefor. The results were tabulated in FIG. 17.

Example 2

In Example 2, the piezoelectric/electrostrictive element 40 was manufactured by a manufacturing method similar to the method of manufacturing a piezoelectric/electrostrictive element according to the first preferred embodiment. In Example 2, the surface treatment in step S104 was omitted, and the electrode films 430 and 432 were connected in a unit to the positive pole of the power supply, instead of being connected to the counter electrode 162.

In Example 2, the piezoelectric/electrostrictive films 412, 416, 420, 424, and 428 were made of an alloy of silver and palladium; and the piezoelectric/electrostrictive films 412,

416, 420, 424, and 428 of a solid solution of lead zirconate titanate and lead nickel niobate. The electrodeposition coating fluid 164 was of an aqueous anion type, in which a coating component was an polyimide resin. Electrophoretic conditions for electrodeposition of the coating material were a temperature of 25° C., an applied voltage of 400 V, and a voltage application time of 20 seconds. The post treatment involved cleaning; 15-minute preliminary drying at 100° C.; and subsequent hardening of the polyimide resin by 30-minute heating at 210° C. This produced the coatings 429 having a thickness of 0.3 μm. In addition, after the formation of the coatings 429, the coating material adhered to the surface of the electrode films 430 and 432 were removed by mechanical polishing in Example 2.

The resultant piezoelectric/electrostrictive element 40 was measured in the same manner as in Example 1 for the amount of flexural displacement and for the insulation resistance to check the pass rates therefor. The results were tabulated in FIG. 17.

Example 3

In Example 3, the piezoelectric/electrostrictive element 10 was manufactured in the same manner as in Example 1, except in that the coating component was alumina nanoparticles negatively charged in a carboxylic dispersant and that the post treatment involved two-hour firing at 900° C. in an electric furnace to sinter the alumina nanoparticles. This produced the coatings 128 having a thickness of 0.2 μm.

The resultant piezoelectric/electrostrictive element 10 was measured in the same manner as in Example 1 for the amount of flexural displacement and for the insulation resistance to check the pass rates therefor. The results were tabulated in FIG. 17.

Example 4

In Example 4, the piezoelectric/electrostrictive element 10 was manufactured in the same manner as in Example 1, except in that the coating component was silica particulates and siloxane oligomer containing a methyl group; that the post treatment involved 15-minute heat treatment at 120° C. to gelatinize a film of the coating material; and that the surface treatment in step S104 was not omitted, i.e., performed. This produced the coatings 128 where silica particulates are dispersed in a gelled film.

The resultant piezoelectric/electrostrictive element 10 was measured in the same manner as in Example 1 for the amount of flexural displacement and for the insulation resistance to check the pass rates therefor. The results were tabulated in FIG. 17.

Comparative Example 1

A piezoelectric/electrostrictive element was manufactured in the same manner as in Example 1, except in that steps S1103 and S1105 to S1109 were omitted.

The resultant piezoelectric/electrostrictive element was measured in the same manner as in Example 1 for the amount of flexural displacement and for the insulation resistance to check the pass rates therefor. The results were tabulated in FIG. 17.

Comparative Example 2

A piezoelectric/electrostrictive element was manufactured in the same manner as in Example 2, except in that steps S103 and S105 to S109 were omitted.

The resultant piezoelectric/electrostrictive element was measured in the same manner as in Example 1 for the amount of flexural displacement and for the insulation resistance to check the pass rates therefor. The results were tabulated in FIG. 17.

Comparison Between Examples and Comparative Examples

As shown in FIG. 17, under ordinary temperature conditions, any of Examples 1 to 4 within the scope of the present invention and any of Comparative Examples 1 and 2 outside the scope of the present invention showed high pass rates for both the amount of flexural displacement and the insulation resistance. However, under high temperature conditions, although Examples 1 to 4 within the scope of the present invention showed high pass rates for both the amount of flexural displacement and the insulation resistance, Comparative Examples 1 and 2 showed low pass rates therefor.

While the invention has been shown and described in detail, the foregoing description is in all aspects illustrative and not restrictive. It is therefore understood that numerous modifications and variations can be devised without departing from the scope of the invention. In particular, it goes without saying that any combination of the techniques described in the first to fourth preferred embodiments will be apparent to those skilled in the art.

What is claimed is:

1. A method of manufacturing a piezoelectric/electrostrictive element including a laminated vibrator made of laminations of a piezoelectric/electrostrictive film and an electrode film, said electrode film comprising an internal electrode film and the method comprising the steps of:
   (a) bringing an electrodeposition coating fluid containing a coating component into contact with said laminated vibrator; and
   (b) selectively electrodepositing a coating material, which is to be a coating, on a defect that is exposed on a surface of said laminated vibrator and reaches said internal electrode film of said laminated vibrator with said coating material being formed from said coating component.

2. The method of manufacturing a piezoelectric/electrostrictive element according to claim 1, wherein
   in said step (a), said electrode film further comprises an external electrode film, wherein said external electrode film of said laminated vibrator which is not short-circuited to said internal electrode film, and a counter electrode are short-circuited, said electrodeposition coating fluid is brought into contact with said laminated vibrator and said counter electrode, said counter electrode being provided separately from said laminated vibrator, and
   in said step (b), voltage is applied between said internal electrode film and said counter electrode so that an electric field formed between said internal electrode film and said counter electrode leaks out of said defect into said electrodeposition coating fluid, causing said coating material to be electrodeposited on said defect.

3. The method of manufacturing a piezoelectric/electrostrictive element according to claim 1, wherein
   in said step (b), said electrode film further comprises an external electrode film and voltage is applied between said internal electrode film and said external electrode film of said laminated vibrator which is not short-circuited to said internal electrode film, so that an electric field formed between said internal electrode film and said external electrode film leaks out of said defect into said electrodeposition coating fluid, causing said coating material to be electrodeposited on said defect.

4. The method of manufacturing a piezoelectric/electrostrictive element according to claim 1, further comprising the step of:
(c) prior to said step (a), growing said defect exposed on the surface of said laminated vibrator.

5. The method of manufacturing a piezoelectric/electrostrictive element according to claim 1, further comprising the step of:
(d) prior to said step (a), subjecting said laminated vibrator to surface treatment to improve the adhesion of said coating to the surface of said laminated vibrator.

* * * * *

UNITED STATES PATENT AND TRADEMARK OFFICE
CERTIFICATE OF CORRECTION

| | | |
|---|---|---|
| PATENT NO. | : 8,042,239 B2 | Page 1 of 1 |
| APPLICATION NO. | : 12/367701 | |
| DATED | : October 25, 2011 | |
| INVENTOR(S) | : Takaaki Koizumi and Hideki Shimizu | |

It is certified that error appears in the above-identified patent and that said Letters Patent is hereby corrected as shown below:

Title Page, Item (56), References Cited, Foreign Patent Documents

"JP 2007-17989 A1 7/2007" should read --JP 2007-175989 A1 7/2007--

Signed and Sealed this
Third Day of January, 2012

David J. Kappos
*Director of the United States Patent and Trademark Office*